(12) United States Patent
Hotzel et al.

(10) Patent No.: US 9,091,943 B2
(45) Date of Patent: Jul. 28, 2015

(54) ASYMMETRIC RETICLE HEATING OF MULTILAYER RETICLES ELIMINATED BY DUMMY EXPOSURES AND RELATED METHODS

(71) Applicants: Arthur Hotzel, Dresden (DE); Matthias Ruhm, Dresden (DE); Eric Cotte, Dresden (DE)

(72) Inventors: Arthur Hotzel, Dresden (DE); Matthias Ruhm, Dresden (DE); Eric Cotte, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 389 days.

(21) Appl. No.: 13/730,171

(22) Filed: Dec. 28, 2012

(65) Prior Publication Data

US 2014/0185030 A1 Jul. 3, 2014

(51) Int. Cl.
| | | |
|---|---|---|
| *G03B 27/52* | (2006.01) | |
| *G03B 27/68* | (2006.01) | |
| *G03B 27/32* | (2006.01) | |
| *G03F 7/20* | (2006.01) | |
| G03B 27/42 | (2006.01) | |
| G03B 27/54 | (2006.01) | |

(52) U.S. Cl.
CPC ........ *G03F 7/70875* (2013.01); *G03F 7/70425* (2013.01)

(58) Field of Classification Search
CPC . G03F 7/70283; G03F 7/703; G03F 7/70425; G03F 7/7055; G03F 7/70558; G03F 7/70716; G03F 7/70875
USPC ................. 355/30, 52, 53, 55, 67–71, 72–77; 250/492.1, 492.2, 492.22, 493.1, 548; 430/5, 8, 22, 30, 311, 312, 321, 394
See application file for complete search history.

(56) References Cited

U.S. PATENT DOCUMENTS

| | | | | |
|---|---|---|---|---|
| 5,134,436 | A | * | 7/1992 | Fujioka ........................ 355/30 |
| 5,581,324 | A | * | 12/1996 | Miyai et al. .................. 355/53 |
| 5,674,650 | A | * | 10/1997 | Dirksen et al. ............... 430/22 |
| 5,811,211 | A | * | 9/1998 | Tanaka et al. ................ 430/30 |
| 6,078,380 | A | * | 6/2000 | Taniguchi et al. ............ 355/52 |
| 6,337,162 | B1 | * | 1/2002 | Irie ................................ 430/5 |
| 6,342,941 | B1 | * | 1/2002 | Nei et al. ...................... 355/52 |
| 6,707,536 | B2 | * | 3/2004 | Nishi ............................ 355/53 |
| 6,710,851 | B1 | * | 3/2004 | Elmer et al. .................. 355/53 |
| 2002/0100012 | A1 | * | 7/2002 | Sutani et al. ................. 716/21 |
| 2007/0263190 | A1 | * | 11/2007 | De Boeij et al. ............. 355/53 |
| 2007/0273851 | A1 | * | 11/2007 | Finders et al. ............... 355/30 |
| 2008/0198351 | A1 | * | 8/2008 | Lin et al. ...................... 355/53 |
| 2009/0148782 | A1 | * | 6/2009 | Kono et al. .................... 430/5 |
| 2012/0156850 | A1 | * | 6/2012 | Yang .......................... 438/381 |

\* cited by examiner

*Primary Examiner* — Christina Riddle

(74) *Attorney, Agent, or Firm* — Ditthavong & Steiner, P.C.

(57) ABSTRACT

Asymmetric heating and/or thermal expansion of a reticle or an image field is reduced. Embodiments include exposing a wafer with an actual image field (including a pattern for a chip layer) on a multilayer reticle, and performing a dummy exposure with another image field of the reticle. Other embodiments include exposing a wafer with a reticle area including both the actual and one or more other image fields of a multilayer reticle, sacrificing any die on the wafer that is exposed with substantial illumination with an image field other than the actual image field. Further embodiments include dummy exposures or enlargement of the illuminated reticle area of a single layer reticle with variation in pattern density between regions of the image field. Further embodiments include changing the image field geometry of a multilayer or single layer reticle.

21 Claims, 13 Drawing Sheets

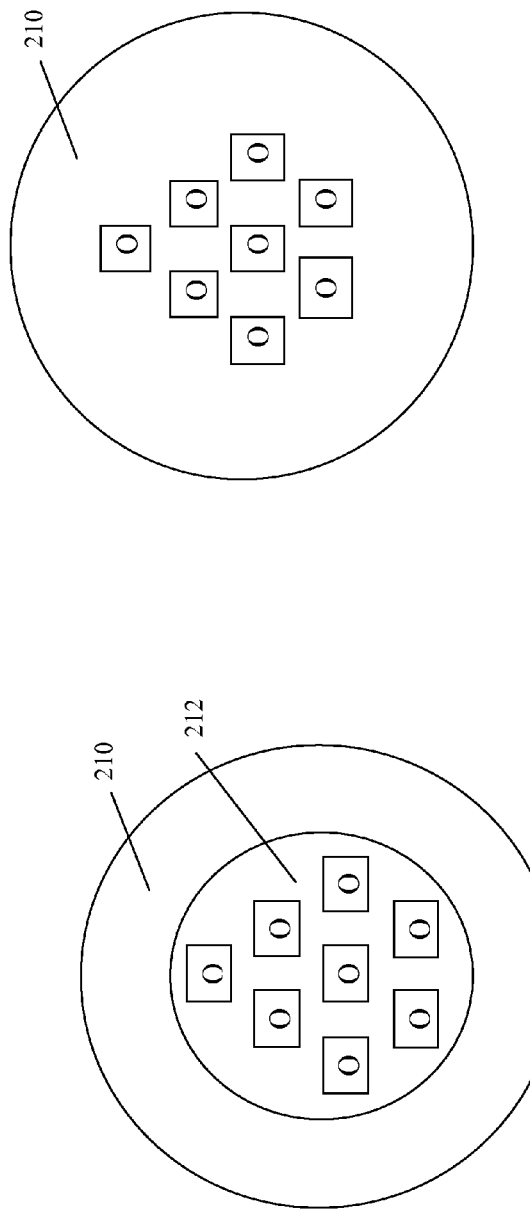
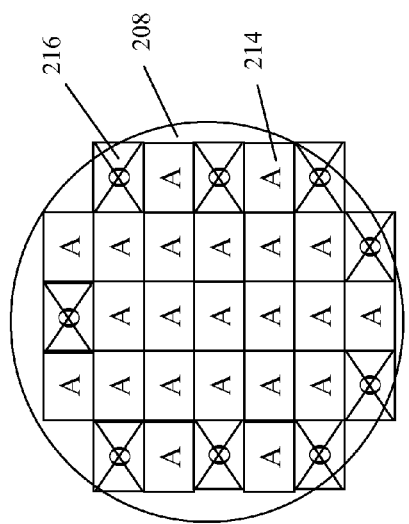
FIG. 2E
FIG. 2F
FIG. 2D

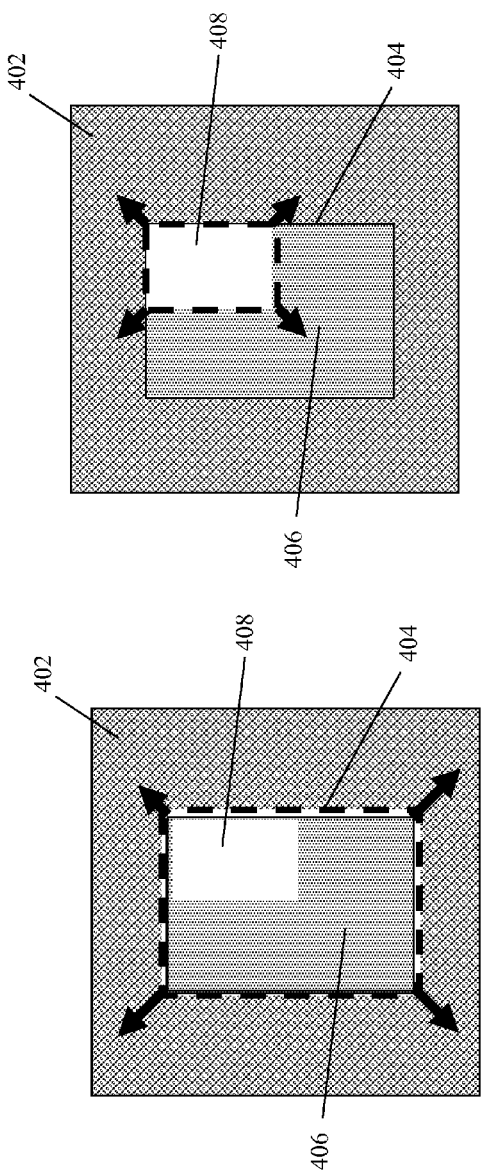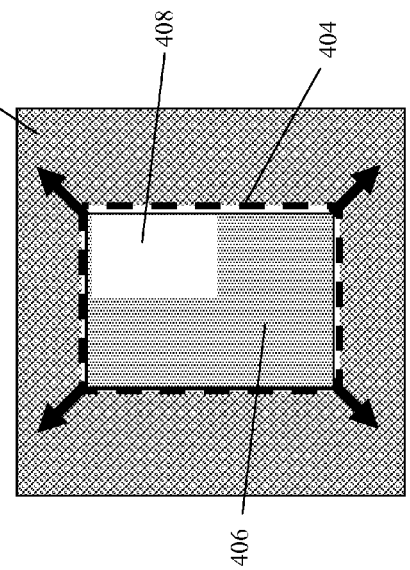
FIG. 4A
FIG. 4B
FIG. 4C

BACKGROUND

BACKGROUND

BACKGROUND

ASYMMETRIC RETICLE HEATING OF MULTILAYER RETICLES ELIMINATED BY DUMMY EXPOSURES AND RELATED METHODS

TECHNICAL FIELD

The present disclosure relates to lithographic reticles employed in semiconductor fabrication. The present disclosure is particularly applicable to multilayer and multiproduct reticles commonly used for low-volume products and test chips.

BACKGROUND

An image field is a rectangular area on a reticle that has the purpose of containing pattern which is exposed in one "shot," "flash," or "scan" in the lithographic process with actinic radiation, thereby leading to the creation of the corresponding pattern in the illuminated exposure field on the processed wafer. The most common type of productive reticles have only one image field which often contains several identical dies with pattern for a specific chip layer. Generally, reticles with one image field will be called single layer reticles in the following. Reticles with more than one image field with pattern for different layers and/or different products are commonly called multilayer or multiproduct reticles, but will be indiscriminately referred to as multilayer reticles in this disclosure for the sake of brevity. A group of reticles containing the pattern for all layers of a chip or product—or, in the case of multiproduct reticles, several products—is called a reticle set. Commonly, all reticles of a reticle set, or at least those that are used with the same or similar types of exposure tools, have the same image field layout or geometry, i.e. the number, dimensions, and positions of the image fields are equal for these reticles. (For the sake of brevity, the possibility of differing standard image field geometries for different classes of exposure tools will not be explicitly mentioned throughout this disclosure; however, when referring to a standard or original image field layout or geometry of a reticle set in the following, these terms are to be understood as being potentially modified by the words "for each class of exposure tools" or "for the class of exposure tools of the reticle"). In the following, an image field containing pattern for a chip layer will be called a functional image field. Other image fields on a multilayer reticle will be called unused image fields. Unused image fields are often present on some reticles of a multilayer reticle set for different reasons. They may be left empty or filled with dummy pattern or other non-productive structures. When referring to the wafer exposure process for a given chip layer, the image field used will be called the actual image field. An exposure of a wafer with the actual image field, with the purpose of creating functional pattern on the wafer, will be called a productive exposure. A wafer processed with the purpose of creating functional pattern on the wafer by productive exposures will be called a productive or product wafer. An exposure with a reticle which has not the purpose of creating functional pattern on a wafer, for example with portions of the reticle not containing the full actual image field, will be called a dummy exposure. A wafer exposed without the purpose of creating functional pattern on the wafer will be called a dummy wafer.

In semiconductor fabrication and lithography, reticle costs can be reduced by combining different image fields containing patterns for different layers of one product, or for the same or different layers of different products, on one reticle. However, employing these multilayer reticles or multiproduct reticles also reduces scanner throughput due to a reduction in the size of the image field as compared to single layer reticles. Such multilayer or multiproduct reticles are therefore mostly used for low-volume products as, for example, test chips.

Reticle heating, which is essentially symmetric in ordinary single layer reticles, occurs through absorption of actinic radiation in the reticle body, and especially in the absorbing, patterned reticle surface. Asymmetric reticle heating is particularly acute in multilayer and multiproduct reticles but can also occur in single layer reticles having substantial variation in average transmission (for transmissive reticles) or reflection (for reflective reticles, e.g. EUV reticles) between different regions of the image field. Reticle heating causes thermal expansion of the reticle. While symmetric reticle heating causes symmetric thermal expansion of the reticle image field, which can mostly be compensated by the optics of the lithographic exposure tool or scanner, asymmetric reticle heating leads to asymmetric expansion. Asymmetric expansion of the reticle image field causes problems or distortions that cannot be sufficiently corrected with many types of scanner optics. Trapezoidal distortion is one of the most troublesome types of distortion. As a consequence, asymmetric reticle heating and thermal expansion can cause overlay degradation that can lead to yield or performance degradation.

Known techniques for mitigating asymmetric reticle heating would substantially slow down current manufacturing processes, increase manufacturing costs, and create technical and logistical issues including those that require redesign of current systems. For example, reducing the scan speed or introducing additional lag times gives the reticle more time for heat dissipation during the exposure sequence and thereby reduces the peak temperature and the maximum distortion of the reticle. However, since the timescale of heat dissipation of the reticle lies in the 10 minute range while the exposure time for a complete wafer is usually less than 1 minute, a significant throughput reduction is needed to achieve a significant overlay improvement. In addition to a reduction in throughput, which in turn increases costs, the longer delay time between wafer preparation and exposure can cause technical problems.

Another alternative to mitigate asymmetric reticle heating is to split up wafer lots (e.g. 12 to 25 wafers) into smaller groups of wafers (e.g. 1 to 3). The smaller split lots are then exposed with sufficient time intervals between each other to allow the reticle to cool down between two split lots. Maximum temperature increase of the reticle during exposure is therefore reduced due to the shorter exposure time required for smaller lots. This option, however, also reduces throughput and speed and requires considerable logistic effort.

A need therefore exists for methodology enabling reduction of asymmetric reticle heating and asymmetric reticle thermal expansion without significantly reducing manufacturing speed and throughput and without significantly increasing costs for multilayer reticles, multiproduct reticles, and single layer reticles having high variations in transmission or reflection.

SUMMARY

An aspect of the present disclosure is a method of reducing asymmetric reticle heating and/or asymmetric thermal expansion of the reticle or the actual image field by performing one or more dummy exposures, illuminating portions of the reticle including regions outside the actual image field and/or portions of the actual image field.

Another aspect of the present disclosure is a method of reducing asymmetric reticle heating and/or asymmetric thermal expansion of the reticle or the actual image field by exposing a wafer with a portion of the reticle that includes both the actual image field and additional areas of the reticle, and sacrificing some portions of the wafer exposed with the additional areas of the reticle.

Another aspect of the present disclosure is a method of reducing asymmetric reticle heating and/or asymmetric thermal expansion of the reticle or the actual image field and/or facilitating the reduction of asymmetric reticle heating and/or asymmetric thermal expansion of the reticle or the actual image field by changing the image field layout of a reticle with respect to the original image field layout of the corresponding reticle set, such that reticle heating and/or thermal expansion during wafer exposure becomes more symmetric with respect to the reticle.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: performing one or more exposures of a wafer with an actual image field on a reticle, the actual image field including a pattern for a chip layer; and performing one or more dummy exposures with portions of the reticle outside the actual image field and/or portions of the actual image field to reduce asymmetric reticle heating and/or asymmetric thermal expansion of the reticle or the actual image field.

Aspects of the present disclosure include alternating performing the one or more dummy exposures and performing the one or more exposures of the wafer with the actual image field of the reticle. Another aspect includes using a higher exposure dosage for the dummy exposures than for the exposure of the wafer with the actual image field of the reticle. Further aspects include performing the dummy exposures for a shorter duration than the exposures of the wafer with the actual image field of the reticle and/or performing fewer dummy exposures than exposures with the actual image field.

An additional aspect includes performing the dummy exposures onto a dummy wafer. Another aspect includes performing the dummy exposures onto one or more areas of the (productive) wafer, sacrificing areas of the wafer that are exposed in the dummy exposures with actinic radiation of an amount that can influence pattern formation on the wafer to a degree that can influence functions of the chip layer. Further aspects include performing the dummy exposures onto edge portions of a chuck with a productive wafer thereon or onto a chuck with no wafer thereon. Additional aspects include performing the dummy exposures onto a substrate remote from both a chuck and a wafer. Another aspect includes exposing a wafer with an actual image field of a multilayer reticle and performing the dummy exposures with a portion of the multilayer reticle including one or more other image fields or portions thereof of the multilayer reticle. Other aspects include exposing a wafer with an actual image field on a single layer reticle and performing the one or more dummy exposures with one or more portions of the actual image field and/or one or more portions of the reticle outside the image field of the single layer reticle. A further aspect includes performing the dummy exposures with one or more regions of the actual image field that have higher transmission or higher reflection than other regions of the actual image field for transmissive or reflective reticles, respectively. An additional aspect includes selecting a dummy exposure dosage, a dummy exposure duration and a number of dummy exposures relative to a number of exposures with the actual image field to apply a substantially uniform heat per area to the reticle by a combination of the exposures with the actual image field and the dummy exposures in a region of the reticle comprising the actual image field and the additional portions of the reticle used for the dummy exposures. Other aspects include calculating the dummy exposure dosage, the dummy exposure duration, and the number of dummy exposures relative to the number of exposures with the actual image field from at least one of: actual image field exposure dosage, actual image field exposure duration, heat applied to the reticle during exposure of the wafer with the actual image field of the reticle, average transmission or reflection for the actual image field, and average transmission or reflection for the portions of the reticle used for the dummy exposures. A further aspect includes spatially modulating the exposure dose in the dummy exposures.

Another aspect includes exposing a wafer using actinic radiation, with an area of a reticle belonging to a reticle set, the area of the reticle including both an actual image field on the reticle with pattern for a chip layer and portions of the reticle outside the actual image field, to reduce asymmetric reticle heating and/or asymmetric thermal expansion of the reticle or the actual image field; sacrificing areas of (or on) the wafer that are exposed with portions of the reticle outside the actual image field with actinic radiation of an amount that can influence pattern formation on the wafer to a degree that can influence functions of the chip layer; and shifting an alignment between each prior or subsequent reticle of the reticle set and the wafer, before each prior or subsequent exposure of the wafer including a prior or subsequent actual image field to expose the same areas of the wafer with the actual image field and each prior and subsequent actual image field.

Other aspects include exposing the wafer with an area of a multilayer reticle, wherein the portions of the reticle outside the actual image field include one or more other image fields or portions thereof. A further aspect includes spatially modulating exposure dose in the portions of the reticle outside the actual image field.

Another aspect of the present disclosure is a method including: providing a reticle having one or more functional image fields for one or more chip layers, the reticle belonging to a reticle set having a standard image field geometry; modifying an image field geometry of the reticle from the standard image field geometry of the reticle set in at least one of the following respects: (i) position of one or more image fields on the reticle, (ii) size and/or shape of and/or number of dies included in one or more image fields on the reticle, (iii) number of image fields on the reticle, and (iv) number of substantially identical copies of one or more image fields on the reticle for symmetric reticle heating and/or reticle thermal expansion and/or reduced asymmetric thermal expansion of one or more image fields in the exposure of one or more wafers with an image field or several substantially identical copies of the image field on the reticle; and exposing one or more wafers with the image field or several substantially identical copies of the image field on the reticle.

Yet another aspect of the present disclosure is a method wherein the reticle set includes a multilayer reticle set, and a number of substantially different image fields on the reticle is less than a maximum possible number of image fields for another reticle of the multilayer reticle set having the standard image field geometry of the set.

Aspects include horizontally and/or vertically centering one or more functional image fields on the reticle. Another aspect includes adding at least one additional die, including a pattern for a chip layer, to at least one image field on the reticle, wherein at least one of the image fields is centered horizontally and/or vertically on the reticle. A further aspect includes adding at least one substantially identical copy of at least one image field to the reticle; and alternating between exposures or batches of exposures of all substantially identical copies of the at least one image field in the exposure of one or more wafers.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 4A through 4C schematically illustrate a dummy exposure with a single layer reticle having substantial variation in average transmission, in accordance with an exemplary embodiment;

FIG. 5C shows a first exposure of a wafer with actual and other image fields according to FIG. 5A, FIG. 5D shows a second exposure of the wafer with actual and other image fields according to FIG. 5B, and FIG. 5E shows the combination of the two exposures;

DETAILED DESCRIPTION

Figure 1A:
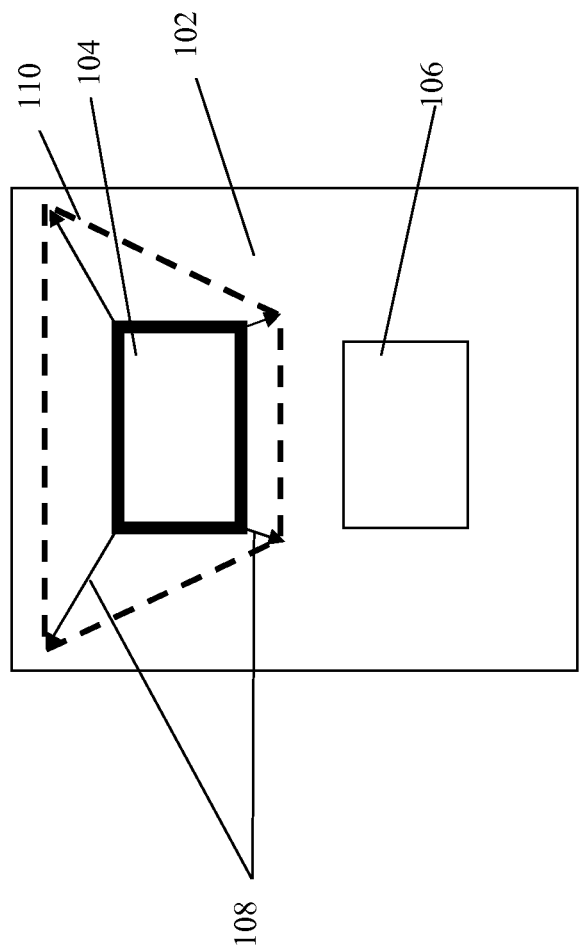
FIG. 1A schematically illustrates asymmetric reticle heating of a multilayer reticle leading to thermal expansion with a large trapezoidal distortion, and FIG. 1B schematically illustrates a dummy exposure with an image field other than the actual image field of the reticle, in accordance with an exemplary embodiment.

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of asymmetric heating of a reticle attendant upon exposing a wafer with an actual image field of the reticle during lithographic patterning of a wafer for a chip layer. In accordance with embodiments of the present disclosure, dummy exposures with another image field of a multilayer reticle even out the heating and resulting thermal expansion of the reticle so that it is symmetric, uniform, or correctable by scanner optics.

Dummy exposures also correct for asymmetric reticle heating induced by variations of the pattern density in the image field of a single layer reticle. For image field regions with less actinic light absorption than other regions (i.e., regions with higher average transmission for transmissive reticles, or higher reflection for reflective reticles) dummy exposures will add additional heat to those regions. As in the case of multilayer reticles, there may be separate dummy exposures of different regions of the image field, or the regions used for the dummy exposures may include portions of the reticle frame area, or dose modulation may be used for the dummy exposures, to achieve the optimum effect of symmetric thermal expansion. Alternatively, asymmetric reticle heating and/or asymmetric thermal expansion of the reticle or the actual image field is reduced by exposing a wafer with a portion of the reticle that includes both the actual image field and additional areas of the reticle, and sacrificing some portions of the wafer exposed with the additional areas of the reticle.

Methodology in accordance with embodiments of the present disclosure includes providing symmetrical reticle heating and/or thermal expansion with either (i) a multilayer reticle or (ii) a single layer reticle with inhomogeneous pattern density of the image field, by adding one or more dummy exposures. In the first instance, the multilayer reticle has an actual image field containing a pattern to be printed on an exposed wafer and one or more other image fields. An exposure dosage and duration is selected for dummy exposures with the other image field or fields and/or other portions of the reticle in combination with the productive exposure with the actual image field to ensure that the overall heating and thermal expansion of the entire reticle is symmetric, uniform, or minimally distorted within a range correctable by scanner optics. In the second instance, the single layer reticle has an image field containing a pattern to be printed on an exposed wafer, with variations in pattern density between regions of the image field. An exposure dosage and duration is selected for dummy exposures with regions of the image field and/or the portions of the reticle outside the image field to ensure that when productive and dummy exposures are combined, the overall heating and thermal expansion of the entire reticle is symmetric, uniform, or minimally distorted within a range correctable by scanner optics. Alternatively, the position of the image field or fields is shifted such that the thermal expansion induced by the productive exposures is more symmetric compared to the original geometry.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

As used herein the term "actual image field" is used to refer to an image field containing the required layer pattern for the wafer exposure. "Other image field" is used to refer to any image field other than the "actual image field" present on the same reticle. The term "unused image field" is used to refer to an image field that contains no pattern for a chip layer whatsoever, but is left empty or filled with dummy fill pattern or other pattern with no productive use. The other image field may be a functional image field belonging to a different layer or product, or an unused image field that is left empty or filled with dummy pattern or other structures. In addition, depending on the geometry of the multilayer reticle and the pattern density distribution of the actual and other image fields, more than one other image field may be illuminated in one exposure, or separate dummy exposures may be performed with different other image fields. For optimum correction of asymmetric thermal expansion, the reticle regions used for the dummy exposures may also contain portions of the frame area around or between the image fields, or portions of the actual image field, or incomplete other image fields, or dose may be modulated in the dummy exposures by the so-called dose mapper function.

Adverting to FIG. 1A, the problem of asymmetrical heating is illustrated. Specifically, FIG. 1A schematically illustrates asymmetric heating of a reticle 102 including two image fields 104 and 106 following exposure (indicated by the thickened lines) with the actual image field 104 used to print a pattern on a product wafer. Since only the actual image field 104 is illuminated, only this region is heated and thermally expands (indicated by the arrow vectors 108). The result is trapezoidal distortion 110 of the actual image field which is translated onto the pattern printed on a product wafer. The optical correction programs of many contemporary scanner equipment are unable to completely correct for this type of distortion.

Figure 1B:
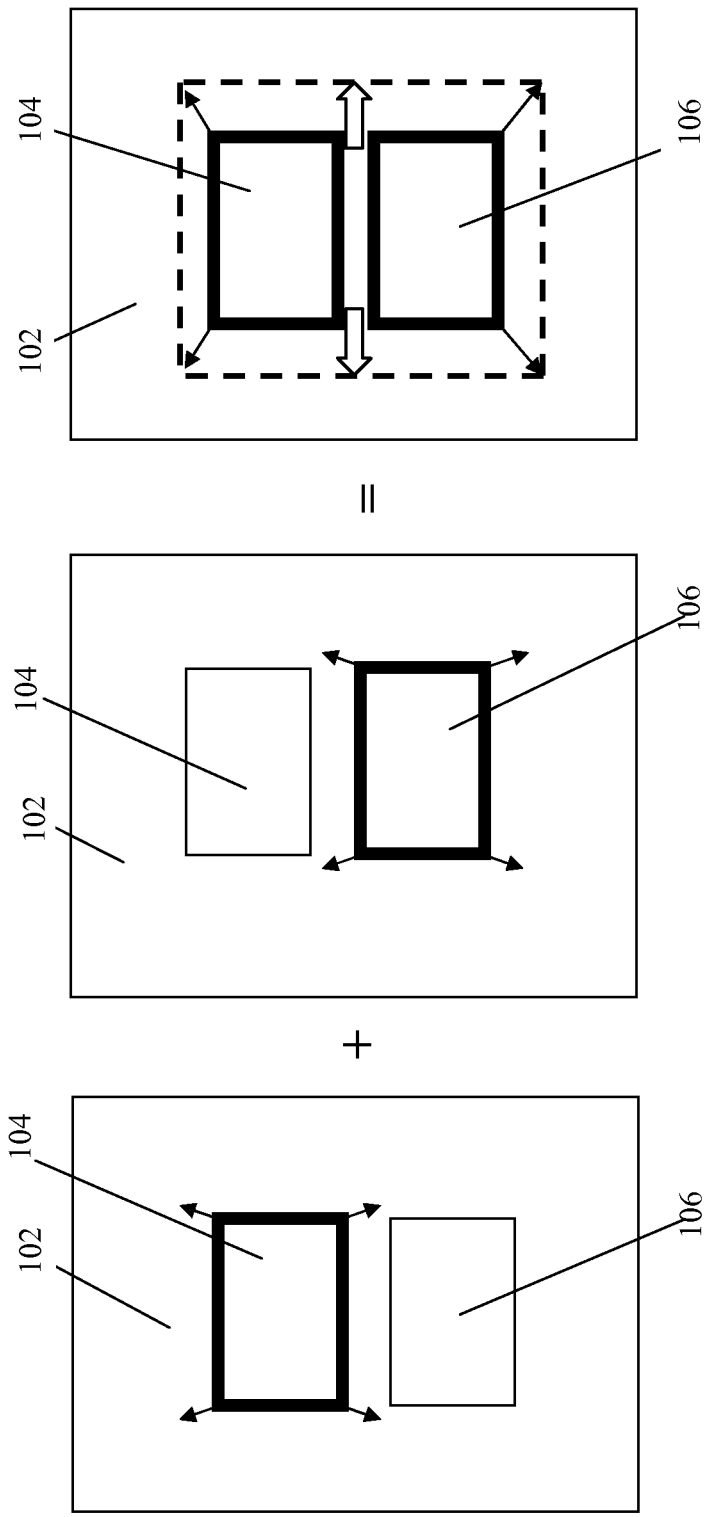

FIG. 1B schematically illustrates the principles of exemplary embodiments of the present disclosure to correct the asymmetric reticle heating and consequently, the trapezoidal distortion. Specifically, if an exposure is applied with illumination of the other image field 106 in addition to applying an exposure with the actual image field 104, then the total illumination, heating, and thermal expansion of the reticle will be substantially symmetric. The exposure of the other image field can happen in an exposure that is separate from the exposure with the actual image field, i.e. in a dummy exposure, or it can happen together with the exposure of the actual image field in the productive exposure of a wafer, by enlarging the illuminated region of the reticle to include both image fields. If the dummy exposure method is used, the parameters of the dummy exposures, namely dose, scan speed, and number of dummy exposures relative to the number of productive exposures, can be adjusted for optimum correction of asymmetric heating as well as maximum wafer throughput.

To obtain symmetric heating and thermal expansion over the course of processing several wafers (a so-called lot), productive and dummy exposures should be performed in an alternating fashion. However, since generally many exposures (for example several hundred) are required to cause substantial reticle heating, and since the time scale of heat dissipation in the reticle is in the order of 10 minutes, while the timescale for exposing one complete wafer is usually less than 1 minute, it is not necessary to alternate at every exposure. Further, since changing the scanner settings between productive and dummy exposures will cost time, a higher throughput will be achieved by performing productive and dummy exposures in a batch mode. Typically, between 100 and several 100 exposures are used for the complete processing of one wafer. Accordingly, a practical method of performing the dummy exposures will consist in performing them before or after the productive exposures for each complete productive wafer. However, other sequences are possible as well. In addition, the dose, speed, and relative number of the dummy exposures are not required to be the same as for the productive exposures to ensure sufficiently homogeneous reticle heating. Further corrections are possible by optimizing the shape and dosage of the dummy exposures including, for example, using the dose mapper modulation technique, although such higher order corrections will probably not be necessary in most cases. Similarly, depending on the specific reticle layout and pattern density distribution, the reticle region used for the dummy exposures may deviate somewhat from the exact area of the other image field. For example, the reticle region for dummy exposures may include portions of the frame area between or around the image fields or portions of the actual image field in addition, to achieve optimum correction.

The dummy exposures with the other image field can be done with a different dosage and/or a different scan speed than the productive exposures with the actual image field. For example, the dummy exposures may be performed at a higher dosage and/or faster scan speed, thereby reducing the number of required dummy exposures and/or the time needed for the dummy exposures. Since the purpose of the dummy exposures is only to heat up certain regions of the reticle, it will be advantageous for throughput to perform them with a higher dose, a higher speed, and in lower relative number compared to the productive exposures. Differences in average transmission or reflection between the actual image field and the other image field (or fields) used for the dummy exposures should be considered in calculating the dosage and duration of the dummy exposures.

More specifically, to a good approximation, (i) energy absorption is proportional to (1−average transmission) for a transmissive reticle or (1−average reflection) for a reflective reticle and (ii) heat transport and cooling within the reticle between successive batches of dummy and productive exposures can be neglected. With the latter approximation the exposure time no longer enters into the calculation, in contrast to the exposure dose (energy per area) which is usually measured in millijoule/centimeter squared (mJ/cm$^2$) and has to be considered.

It must be taken into account that there may be fewer dummy shots than productive shots per wafer to save time. The basic formula to calculate the required dummy exposure dose for a transmissive reticle is then:

$$\text{Dose(dummy)} = \text{Dose(productive)} \times \frac{n(\text{productive}) \times (1 - T(\text{productive}))}{n(\text{dummy}) \times (1 - T(\text{dummy}))}$$

in which n denotes the number of exposures (flashes, shots, scans) per wafer, T denotes the average transmission of the reticle image field, and the argument "dummy" or "productive" denotes the dummy exposure with the other image field, or the productive exposure with the actual image field, respectively. For a reflective reticle, transmission (T) is to be replaced by reflection (R). More sophisticated approaches might take into account things like heat transport, cooling, light absorption in the reticle glass body, and inhomogeneous pattern density. Alternatively, the dummy exposure dose might be fine-tuned based on measured overlay data, potentially by way of an automated feedback loop. Limitations that may apply to the productive exposures concerning e.g. precision of alignment, dose, and imaging quality will generally be much reduced for the dummy exposures. While the productive exposures with the actual image field of the reticle are typically directed at a product wafer to print a target pattern on the wafer, the dummy exposures may be directed at anything. For example, the dummy exposures may be performed in thin air, directed at a chuck portion, directed at a dummy wafer, or directed at sacrificial dies of the product wafer. Since the latter will generally be lost for productivity, it will be advantageous to choose them at positions that are known to give lower or no chip yield anyway (e.g. edge dies), and/or to keep their numbers low, by performing fewer dummy exposures than productive exposures with an accordingly higher dose and/or by directing several dummy exposures at the same sacrificial dies.

Figure 2B:
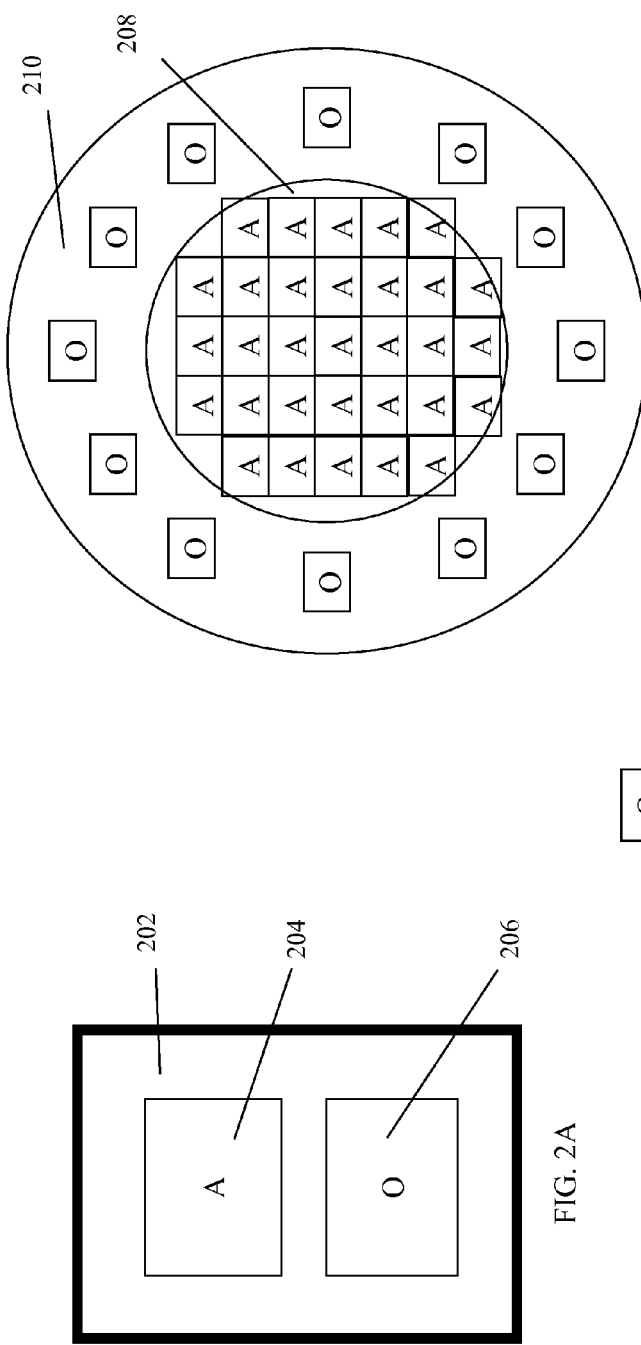
FIG. 2A schematically illustrates a reticle with an actual image field (A) and another image field (O), FIG. 2B schematically illustrates a dummy exposure by exposing an outer chuck region with the other image field (O) of the reticle, in accordance with an exemplary embodiment, FIG. 2C schematically illustrates a dummy exposure by exposing thin air with the other image field (O) of the reticle, in accordance with an exemplary embodiment, FIG. 2D schematically illustrates a dummy exposure by exposing a dummy wafer with the other image field of the reticle (O), in accordance with an exemplary embodiment, FIG. 2E schematically illustrates a dummy exposure by exposing a wafer chuck without a wafer with the other image field (O) of the wafer, in accordance with an exemplary embodiment, and FIG. 2F schematically illustrates a dummy exposure by exposing sacrificial dies of a wafer with the other image field (O) of the reticle, in accordance with an exemplary embodiment.
Figure 2C:
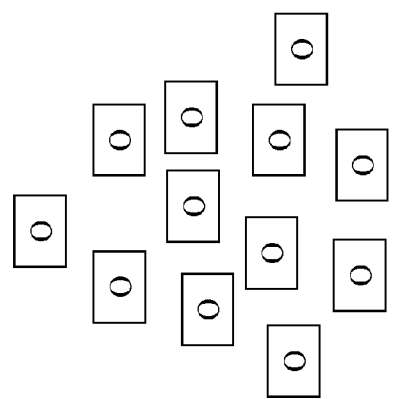
Figure 2A:
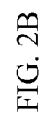

Adverting to FIGS. 2A through 2E, exemplary implementations of dummy exposures are provided in FIGS. 2B through 2E for exposures with reticle 202 of FIG. 2A including an actual image field (A) 204 and another image field (O) 206. In FIGS. 2B through 2E, the fields on a wafer or other substrates exposed with the actual (A) or other (O) image field are marked accordingly. FIG. 2B illustrates exposing a product wafer 208 with the actual image field (A) 204 while the surrounding wafer chuck portion 210 is exposed with the other image field (O) 206. As can be seen, the number of dummy exposures is less than the number of productive exposures, which is beneficial for throughput. In order to still obtain the same temperature increase in the actual and the other image field of the reticle, the dose for the dummy exposures must be increased accordingly. However, care must be taken to avoid excessive local chuck heating during the dummy exposures, which might lead to thermal distortion of the current or subsequent product wafers.

FIG. 2C illustrates applying the dummy exposures with the other image field (O) 206 to a substrate remote from both the chuck and the product wafer, including, for example, thin air (as shown). This may not be an option with all exposure equipment, but when possible, it wastes no resources (like dummy wafers or sacrificial dies), and avoids risk by chuck or wafer heating. FIG. 2D illustrates applying dummy exposures with the other image field (U) 206 to a dummy wafer 212. The dummy wafer, which does not have to be coated with a photoresist, can be re-used, e.g. for other dummy exposures, and later be discarded, as the dummy exposures serve only to heat the other image field portion of the reticle. FIG. 2E illustrates applying the dummy exposures with the other image field 206 to a chuck 210 without a wafer. FIG. 2F illustrates applying dummy exposures with the other image field (O) 206 to sacrificial dies of the same product wafer 208 that is exposed with the actual image field (A) 204 (assuming here that the other image field is not completely "dark", such that non-productive pattern is actually printed in the sacrificial dies). In other words, the dies that are sacrificed are areas of the wafer that are exposed in the dummy exposures with actinic radiation of an amount that can significantly influence pattern formation on the wafer, i.e. can influence pattern formation to a degree that can influence functions of the chip layer. The desirable dies in the exposure fields 214 of the wafer printed with the pattern from the actual image field are retained while the sacrificial dies in the exposure fields 216 resulting from exposure with the other image field are discarded. While this embodiment results in die loss, it may still be the most economical solution in cases where equipment limitations do not allow exposure of the bare chuck region (e.g. FIG. 2A) since a separate wafer loading or unloading is not required for the dummy exposures. As illustrated, it is beneficial to use fewer exposure fields for the dummy exposures than for the productive exposures, either by increasing the dose used for the dummy exposures or by directing more than one dummy exposure to the same wafer area, and to choose wafer regions that are known to give lower die yield for the dummy exposures, e.g. wafer edge regions. However, care must be taken to avoid defect creation in subsequent wafer processing steps such as etching and polishing, as well as excessive local heating of the wafer and the chuck. Which approach is appropriate will depend on cost and the constraints of the lithographic equipment.

Herein, one boundary condition may potentially be that too high a number of dummy exposures of the same dies, or too high a dummy exposure dose might lead to defects that could spread to other regions of the wafer. For completeness, it should be mentioned that in some rare cases areas of a productive wafer exposed in the dummy exposures may still be usable for production, namely if the reticle areas illuminated in the dummy exposures are completely "dark", i.e. non-transmissive or non-reflective, such that actually no actinic radiation reaches the wafer from these areas. If the dummy exposures are directed at the productive wafer, the wafer chuck, or a dummy wafer attached to the chuck, a further boundary condition will be imposed by the fact that dummy exposures will deposit energy in the wafer and/or chuck that will lead to a local temperature increase. An excessive local temperature increase may lead to local thermal expansion of the productive wafer or subsequent productive wafers with a negative impact on overlay accuracy. Therefore, it may not be possible to perform an arbitrary number of dummy exposures at the same position in a short time span, or to use an arbitrarily high dummy exposure dose, and it will generally be beneficial to place the dummy exposures symmetrically with respect to the wafer if they are directed at a wafer or wafer chuck. Other boundary conditions may be imposed by the hardware and software of the scanner equipment.

Figure 3C:
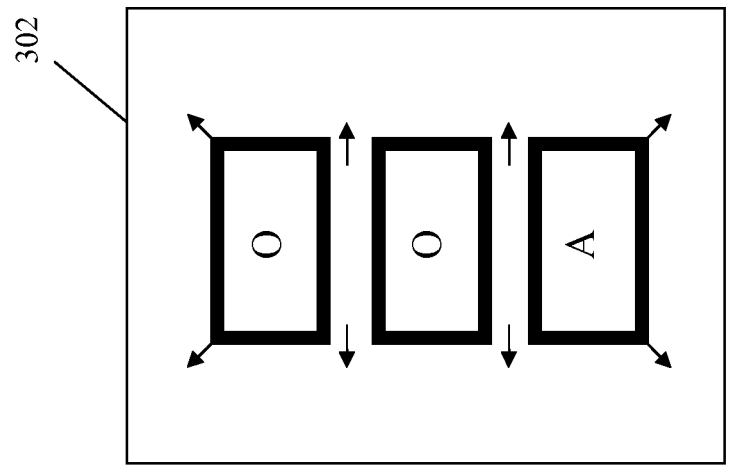
FIGS. 3A and 3C schematically illustrate dummy exposures required for the top and bottom image fields on a multilayer reticle with three image fields, in accordance with exemplary embodiments, and FIG. 3B schematically illustrates no required dummy exposure for the middle image field, which is geometrically centered on the reticle.
Figure 3B:
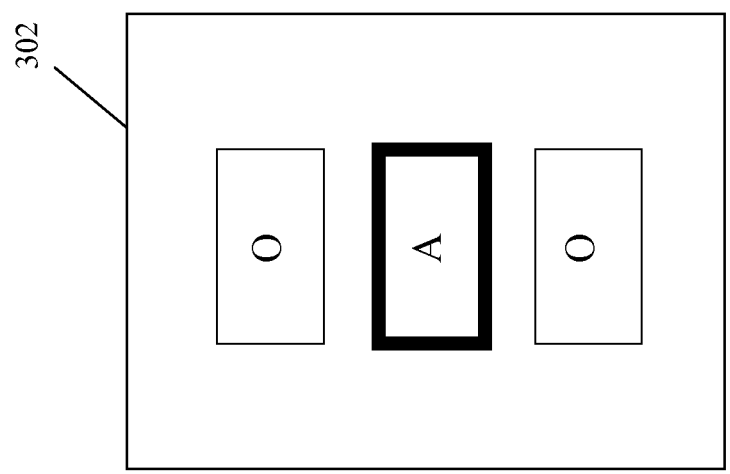
Figure 3A:
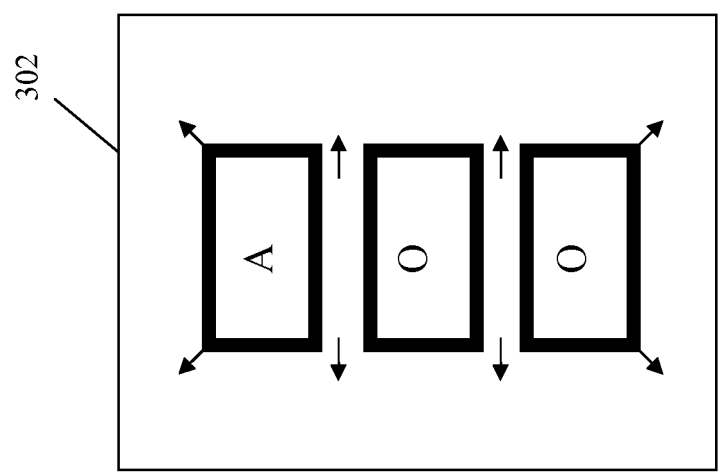

FIGS. 3A through 3C schematically illustrate when and how dummy exposures with image fields other than the actual image field are required for symmetric reticle heating depending on the position of the actual image field relative to the other image fields, in accordance with another exemplary embodiment. The illustrations show a multilayer reticle with three image fields which all assume the role of actual image field (A) in the patterning of the corresponding chip layers. When the actual image field 304 is symmetrically positioned on the reticle 302 and with respect to first and second other image fields 306 and 308, as shown in FIG. 3B, dummy exposures with the other image fields are not necessary to achieve symmetric reticle heating (as indicated by the thin outlines of image fields 306 and 308 in contrast to the thick outline of actual image field 304 which is exposed). However, when the actual image field (A) 304 is positioned asymmetrically with respect to a first other image field 306 and a second other image field 308, as shown in FIG. 3A and FIG. 3C, dummy exposures with both other image fields must be performed for symmetric reticle heating. While it is possible to perform dummy exposures with the two other image fields in FIG. 3A or 3C separately, it will generally be more advantageous for throughput to perform dummy exposures with a portion of the reticle that includes both other image fields in the same "shot" or "scan"—provided that both other image fields have similar average transmission/reflection and will thus require a similar dose for homogeneous reticle heating (dose mapper modulation may ease this constraint). However, there may be other practical considerations that influence this decision.

The principles and techniques of the present disclosure can also be applied to single layer reticles having inhomogeneous pattern density or variation in average transmission (for transmissive reticles) or reflection (for reflective reticles) between different regions of the image field in order to achieve a more symmetric reticle heating and thermal expansion. FIGS. 4A through 4C show an exemplary embodiment schematically illustrating an example of this application. A single layer reticle 402 has an image field 404 including a region of lower transmission/reflection 406 and a region of higher transmission/reflection 408. Following productive exposure of a wafer with the complete image field, as indicated by the thick dashed outline in FIG. 4A, the image field region 406 with lower transmission/reflection is heated up more than the region 408 with higher transmission/reflection, since more actinic radiation per area is absorbed by the reticle in the former than in the latter. As a consequence, reticle heating is asymmetric, and thermal expansion of the image field is asymmetric as well, as indicated by the different sized arrows in FIG. 4A. A dummy exposure with only the higher transmission/reflection region of the image field, as indicated in FIG. 4B by the thick dashed outline, injects additional heat into this region which leads to additional thermal strain, as indicated by the arrows in FIG. 4B. As a result of both exposures, homogeneous heating of the image field and symmetric thermal expansion are achieved, as illustrated by the arrows in FIG. 4C. As to the parameters of the dummy exposures and the placement of these exposures at the wafer level, similar considerations apply as in the case of multilayer reticles, as illustrated e.g. in FIGS. 2B through 2F. Although not shown in separate illustrations, a similar dummy exposure method as the one illustrated in FIGS. 4A through 4C may also be used for multilayer reticles with inhomogeneous pattern density in either the actual or one or more of the other image fields. By this exposure method higher order correction of asymmetric reticle heating can be achieved, either by additional dummy exposures with portions of image fields, or by modifying the area of the dummy exposures of "other" image fields to include partial image fields.

Reverting to multilayer reticles and in accordance with another exemplary embodiment, separate dummy exposures of other than the actual image fields are not needed when the same product wafer can be exposed with both the actual and the other image field or fields in one "shot" or "scan", which will in most cases mean that the loss of sacrificial dies will have to be accepted. FIGS. 5A through 5E illustrate this embodiment for a two layer multilayer reticle. The same product wafer 502 is exposed at one chip layer with reticle 508 shown in FIG. 5A, and at another chip layer with reticle 514 shown in FIG. 5B. In the first case, the upper image field 504 is the actual image field (A1) while the lower image field 506 acts as "other" image field (O1) while in the second case the situation is reversed (O2, A2). Actually, reticles 508 and 514 may also be one and the same reticle used at two different chip layers whereupon the roles of "actual" and "other" image field are reversed. Instead of employing dummy exposures, the illuminated reticle area is increased to include both the actual and the other image field at both chip layers, as indicated by the thick dashed outlines in FIGS. 5A and 5B. In consequence, symmetric reticle heating and thermal expansion are achieved (with the prerequisite that both image fields of the reticle have similar pattern density, which will however be often fulfilled for critical chip layers; otherwise, optimization by dose modulation—"dose mapper"—may be envisaged). The resulting wafer patterns are illustrated in FIGS. 5C and 5D, respectively. Both the patterns of the actual image fields (A1, A2) and the patterns of the other image fields (O1, O2) are printed on the wafer. Since only the pattern of the actual image fields will lead to functional chips, the alignment between the wafer 502 and the reticles has to be shifted between the chip layers, such that the patterns of the actual image fields A1 and A2 are overlayed with each other on the wafer, as shown in FIG. 5E. A corresponding adjustment of the alignment has to be performed at every chip layer. As a result, the exposure fields on the wafer where the patterns of the actual image fields are overlayed with each other (516) have the potential of yielding functional chips, while the exposure fields containing pattern from the other image fields are a priori lost as sacrificial dies. In other words, 50% of the dies are sacrificed from the beginning with this method (for multilayer reticles with more than two image fields, the percentage of lost dies will accordingly be even greater). Thus, the cost per functional die will be close to doubled compared to the conventional exposure scenario (some measurement and inspection costs can in fact be saved on the sacrificial dies, but this will not fundamentally change the calculation). In comparison to this, the dummy exposure method is more economical, since the price for it consists only in fewer if any sacrificial dies and a reduction in throughput for the overlay critical layers. Still, for some test chips and very low volume products the 50% (or higher) sacrificial die loss may be acceptable in return for the gain in overlay capability and the somewhat easier logistics in comparison with the dummy exposure method. Also, some embodiments of the dummy exposure method may not be feasible due to tool constraints, which is unlikely to be the case for the method illustrated in FIGS. 5A through 5E. However, also with the latter method, care must be taken to avoid defects and problems in subsequent wafer processing steps in the exposure fields containing the pattern of the "other" image fields.

Figure 5A:
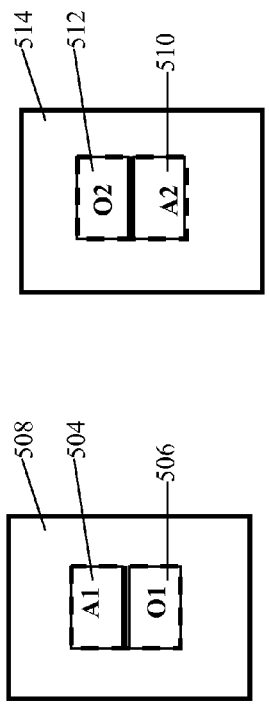
FIGS. 5A through 5E schematically illustrate a sequence of exposures of a wafer with a multilayer reticle set wherein the portion of the reticles that is exposed includes two image fields, of which only one is the active image field for any chip layer, in accordance with an exemplary embodiment, resulting in sacrificial dies on the wafer.
Figure 5B:
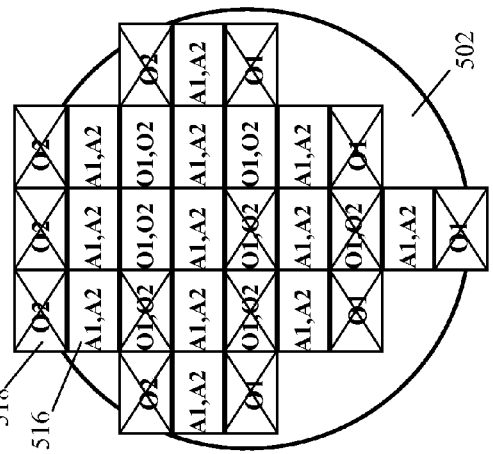
Figure 5C:
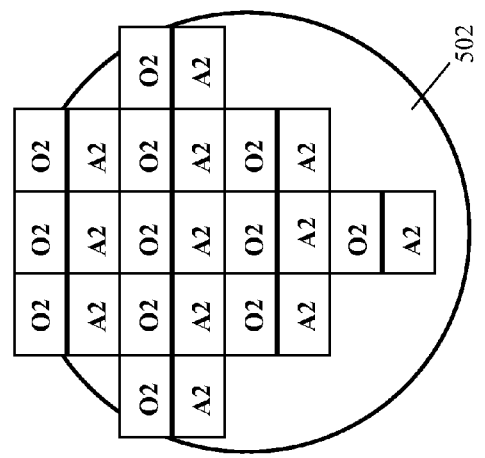
Figure 5D:
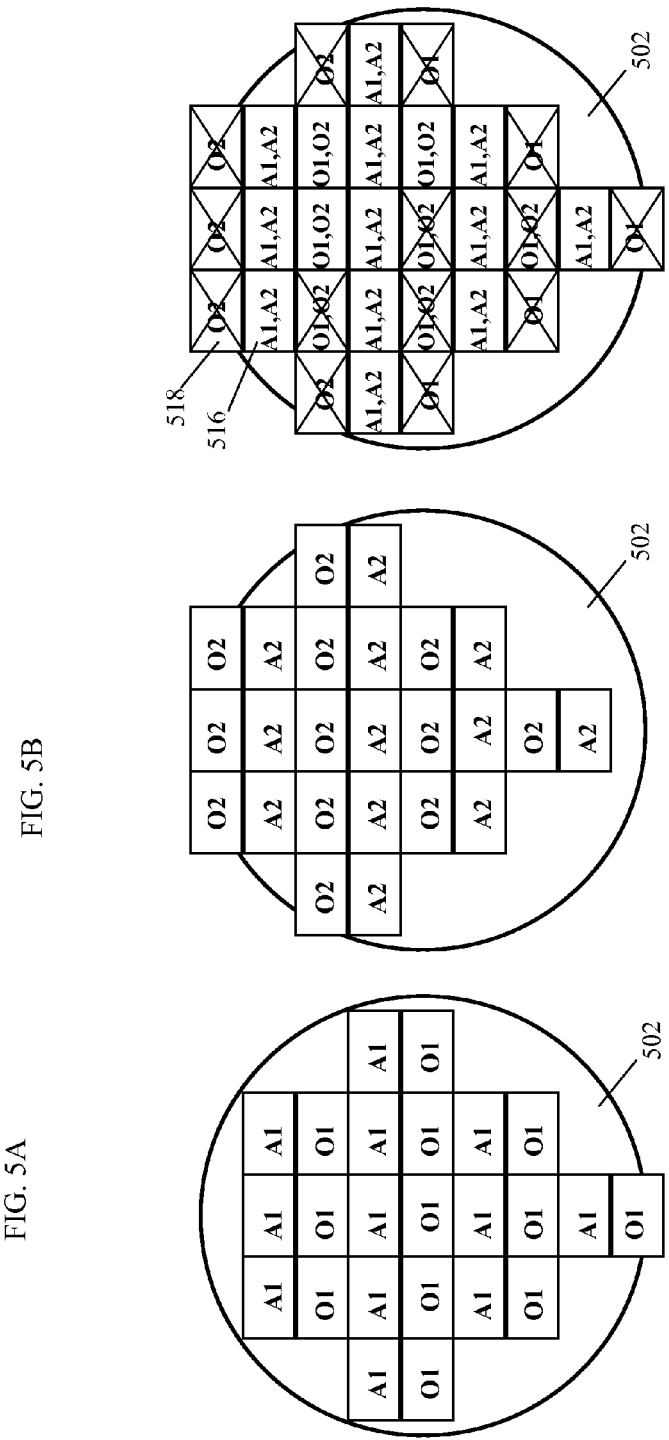
Figure 5E:
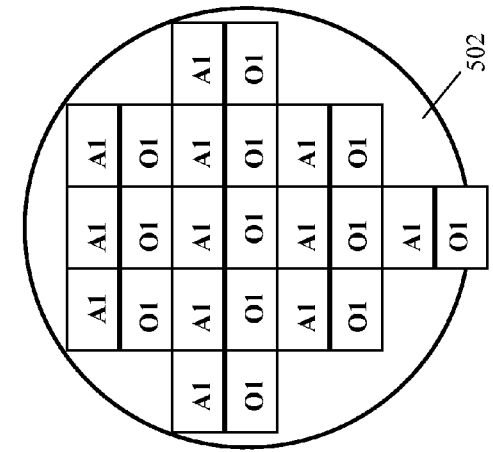

Even with the increase of the illuminated reticle area beyond the actual image field (as illustrated in FIGS. 5A and 5B) the sacrifice of wafer area can be avoided, if the illuminated extra area is completely dark (i.e. non-transmissive or non-reflective for transmissive or reflective reticles, respectively), such that no significant amount of radiation is passed from this area on to the wafer. This requires the "other" image field to be an unused image field that is left empty of pattern. Then, areas containing the pattern of the actual image field can be placed adjacent to each other on the wafer such that no wafer area is lost. However, the above mentioned condition has to be fulfilled at every chip layer where the illuminated reticle area is increased beyond the active image field. This scenario appears unlikely, but may apply in some cases where correction of asymmetric reticle heating is performed only for very few overlay critical chip layers.

Figure 6B:
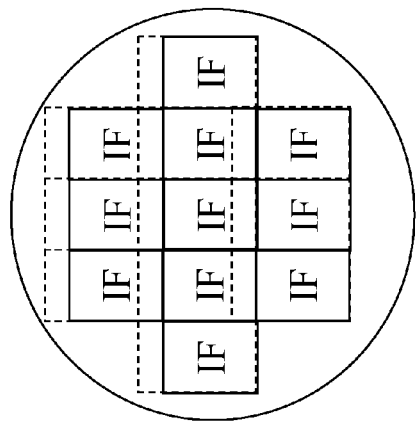
FIG. 6B schematically illustrates the placement of the exposure fields on the wafer in case that the additional portion of the reticle is completely non-transmissive or non-reflective, respectively.
Figure 6C:
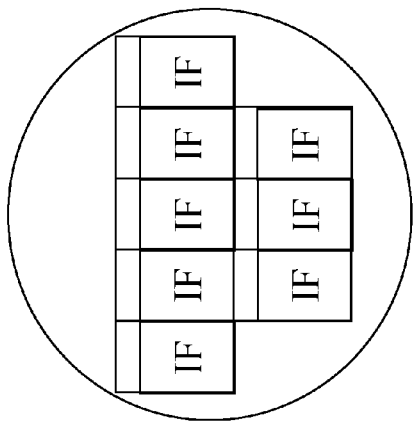
FIG. 6C schematically illustrates the placement of the exposure fields on the wafer in case that the additional area of the reticle is not completely non-transmissive or non-reflective.
Figure 6A:
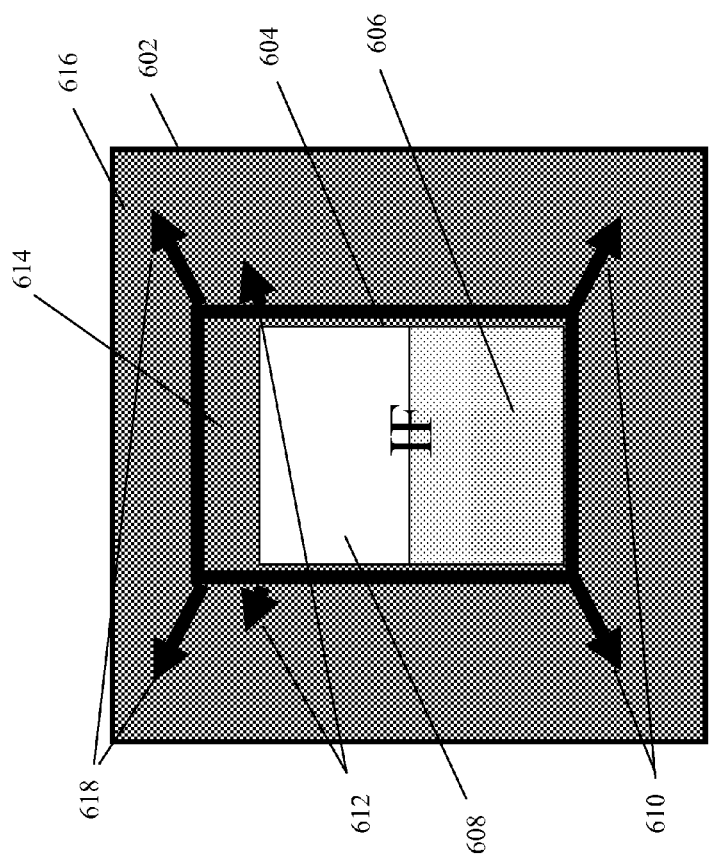
FIG. 6A schematically illustrates the exposure of a wafer with a single layer reticle having substantial variation in average transmission, wherein the portion of the reticle that is illuminated includes the actual image field and an additional area of the reticle, in accordance with an exemplary embodiment.

In accordance with another exemplary embodiment shown in FIGS. 6A through 6C, an enlargement of the illuminated reticle area beyond the image field can also be used to correct asymmetric reticle heating and thermal expansion for single layer reticles with inhomogeneous pattern density within the image field. As shown in FIG. 6A, reticle 602 has an image field 604 with lower transmission/reflection in the lower region 606 and higher transmission/reflection in the upper region 608. Thus, when illuminating the exact area of the image field, a higher percentage of the actinic radiation is absorbed by the reticle in region 606 than in region 608, such that the temperature increase and the build-up of thermal strain is higher in the lower image field region, leading to trapezoidal distortion as indicated by arrows 610 and 612. By adding a portion 614 of the frame area 616 above the image field to the illuminated area, as indicated by the thick outline, an additional infusion of heat and thermal strain is induced in the upper reticle region, the frame area being substantially dark, i.e. non-transmissive/non-reflective. As a result, a more symmetric thermal expansion is achieved as indicated by arrows 610 and 618. The optimum extent of additional frame illumination can be determined by simulation or experiment. If the frame area that is illuminated in addition to the image field is really 100% dark, the exposure fields can be placed on the wafer as illustrated in FIG. 6B: Areas corresponding to the reticle frame region are overlayed with areas corresponding to the image field of adjacent exposure fields, as indicated by the dashed lines, without loss of productive wafer area. If, on the other hand, the illuminated frame area is not totally dark, e.g. if it contains some auxiliary structures or pinhole defects, the exposure fields have to be arranged on the wafer as illustrated in FIG. 6C, with wafer areas corresponding to the frame area of the reticle being sacrificed. Although not shown in a separate illustration, as an alternative to enlarging the reticle area illuminated in the productive exposures beyond the image field, portion 614 of the frame area could also be exposed in separate dummy exposures to achieve substantially the same effect. Furthermore, exposing portions of the frame area together with the actual or other image field(s) in productive or dummy exposures may also be employed to (further) reduce asymmetric thermal expansion in multilayer reticles.

Reverting again to multilayer reticles, sometimes some reticles of a multilayer reticle set contain fewer than the maximum possible number of functional image fields (with respect to the standard image field geometry of the set), e.g. because no further chip layers are available of which the pattern could suitably be added to the reticle. In this case, the common practice is to have unused image fields on these reticles which are either left empty or filled with dummy pattern or other non-productive structures. For example, as illustrated in FIG. 7A, the functional image field, labeled F11, and an unused image field, labeled U, are placed on the reticle 702 together. However, since the functional image field is not placed symmetrically with respect to the reticle, productive exposures with this image field will lead to asymmetric reticle heating and thermal expansion.

Figure 7B:
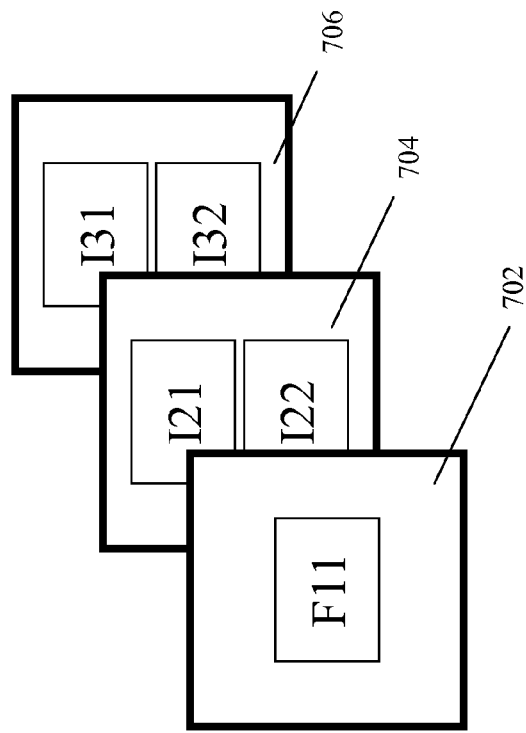
FIGS. 7A through 7D schematically illustrate symmetric adjustment of the geometry of image fields on a multilayer reticle containing a pattern for one chip layer, in accordance with exemplary embodiments.
Figure 7A:
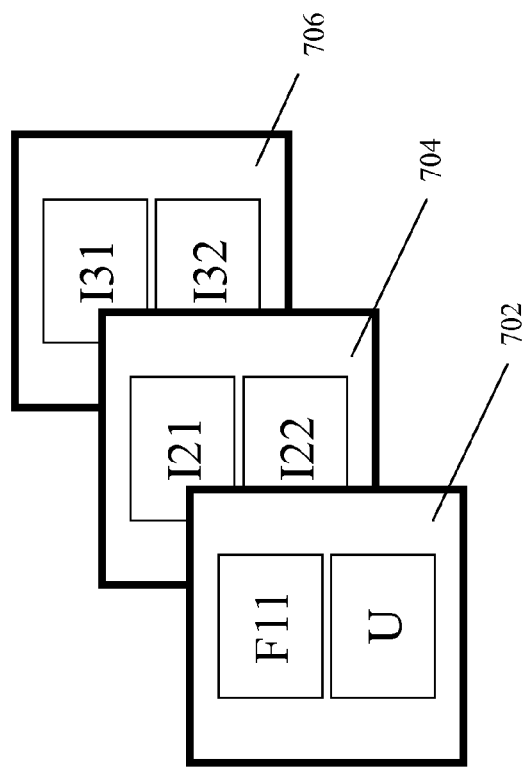
Figure 7D:
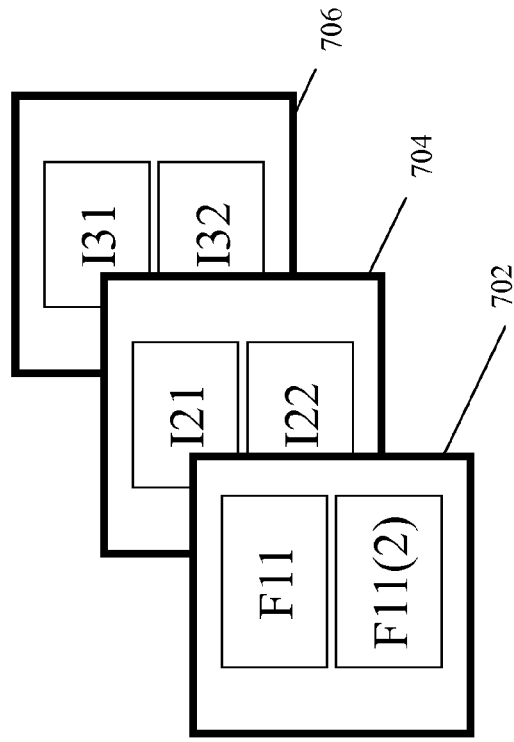
Figure 7C:
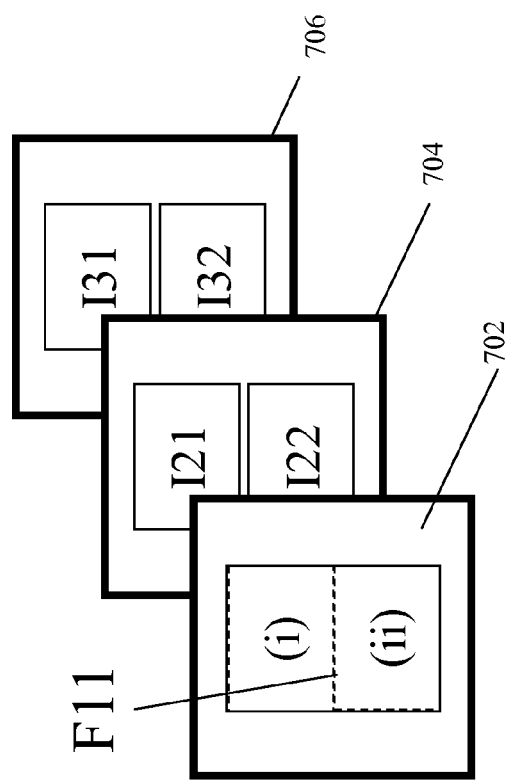

In accordance with exemplary embodiments of the present disclosure, illustrated in FIGS. 7B through 7D, asymmetric reticle heating and thermal expansion is reduced by changing the image field geometry, such that heating and expansion upon productive exposure are more symmetric with respect to the reticle. As shown, reticle 702 belongs to a set of two layer multilayer reticles, but has only one functional image field F11. In one embodiment, shown in FIG. 7B, image field F11 is moved to the center of the reticle while eliminating the unused image field. Since F11 is now arranged symmetrically with respect to the reticle, the issue of asymmetric reticle heating and thermal expansion is solved without the need for countermeasures that would lead to wafer area and/or throughput loss.

In another embodiment, shown in FIG. 7C, the unused image field is eliminated, and the number of dies in the functional image field F11 is doubled (e.g., from 1 to 2), with the original die(s) labeled (i) and the additional die(s) labeled (ii). The area of image field F11 is thus substantially doubled, the additional dies substantially occupying the area taken up by the unused image field U in FIG. 7A. Thus, the center of the functional image field is moved to the reticle center, ensuring symmetric reticle heating during productive exposures. A further adjustment may be made to fully center F11 on the reticle. When exposing a wafer with reticle 702 from FIG. 7C, one exposure field of image field F11 will be overlayed with two exposure fields of other image fields as, for example, I21 or I22. Thus, not only is symmetric reticle heating and thermal expansion achieved in the exposures with reticle 702, but also throughput is increased due to the larger image field F11.

A somewhat similar embodiment is illustrated in FIG. 7D. Here, instead of adding further dies to F11, the unused image field U from FIG. 7A is replaced with an additional copy of image field F11 labeled F11 (2). In the processing of a product wafer at the corresponding chip layer, exposures with the image fields F11 and F11 (2) are done in alternating batch mode (e.g., on a wafer by wafer basis). Thus, overall symmetric heating of reticle 702 is achieved, while all exposures have the potential of yielding functional chips. The essential difference between adding more dies to the image field (FIG. 7C) and adding another copy of the image field to the reticle (FIG. 7D) lies in the mode of exposure. Specifically, dies of the same image field are exposed in the same "shot" or "scan," whereas different image fields are exposed separately. A reason to choose an additional copy of the functional image field (FIG. 7D) over additional dies in the functional image field (FIG. 7C) might be, for example, the need for separate overlay correction of the exposure fields in the productive exposures with reticle 702 from FIG. 7D.

Figure 8B:
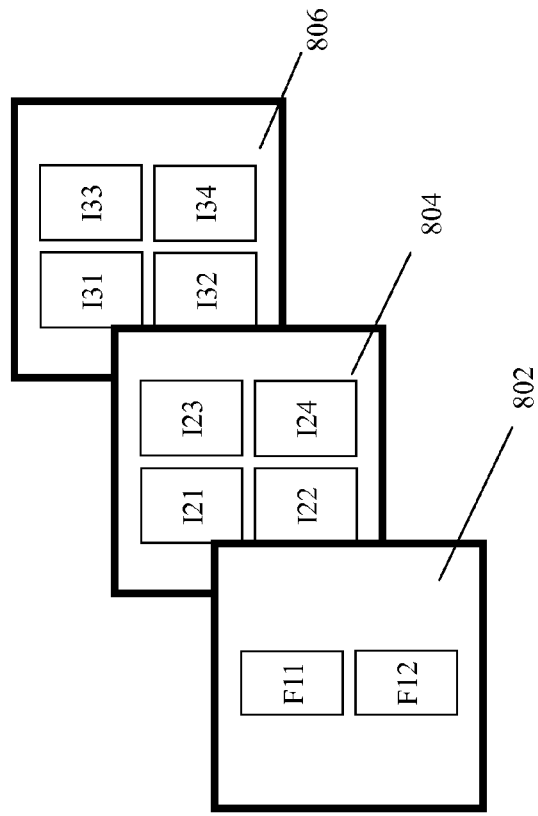
FIG. 8A through 8D schematically illustrate symmetric adjustment of the geometry of image fields on a multilayer reticle containing a pattern for two chip layers, in accordance with exemplary embodiments.
Figure 8A:
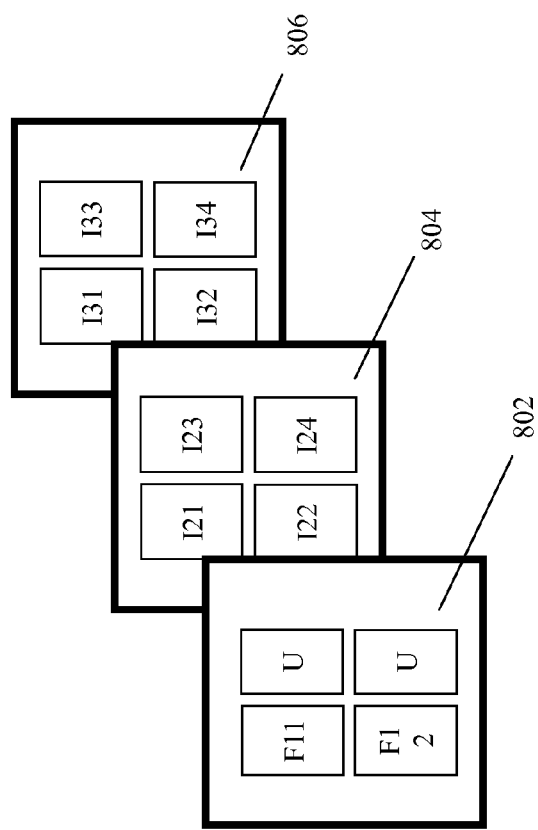
Figures 8C, 8D:
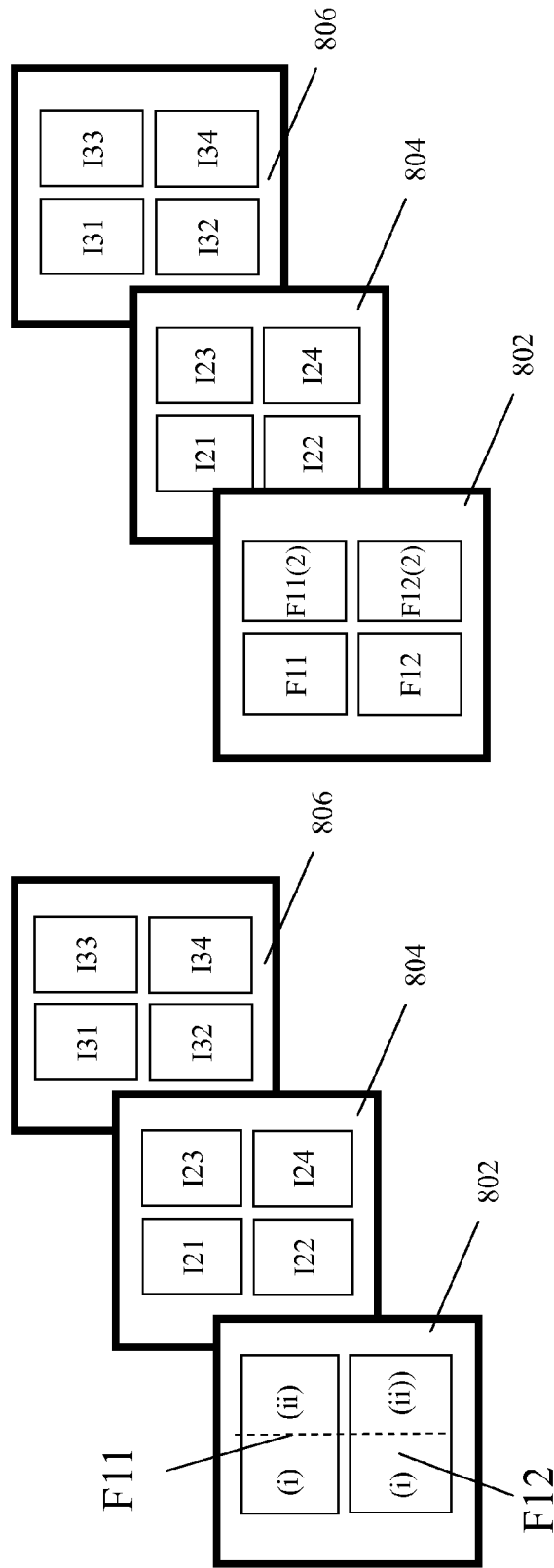

FIGS. 8A through 8D illustrate embodiments of this disclosure that correspond to the embodiments shown in FIGS. 7A through 7D, but for the case of a 4 layer multilayer reticle set (with a 2 by 2 image field layout) in which a reticle 802 has only two (rather than 4) functional image fields (F11 and F12). As in FIGS. 7B through 7D, the unused image fields U present on 802 in the conventional arrangement shown in FIG. 8A are eliminated, and the functional image fields of 802 are centered horizontally on the reticle (FIG. 8B), the numbers of dies in the functional image fields of 802 are doubled (FIG. 8C), or a further copy of each functional image field is added to 802 (FIG. 8D). As a result, a symmetric arrangement in the horizontal direction of the functional image fields is achieved for reticle 802 in FIGS. 8B through 8D. Although reticle heating will thus still be asymmetric if only the actual image fields of reticle 802 are illuminated, correction of asymmetric heating by additional illumination of the other image fields (for example the embodiments illustrated in FIGS. 1 through 3 and 5) is facilitated, as the area that needs to be illuminated in addition to the actual image fields is now substantially the same size as the actual image fields and not, as in the conventional arrangement shown in FIG. 8A, three times as large.

Figure 9B:
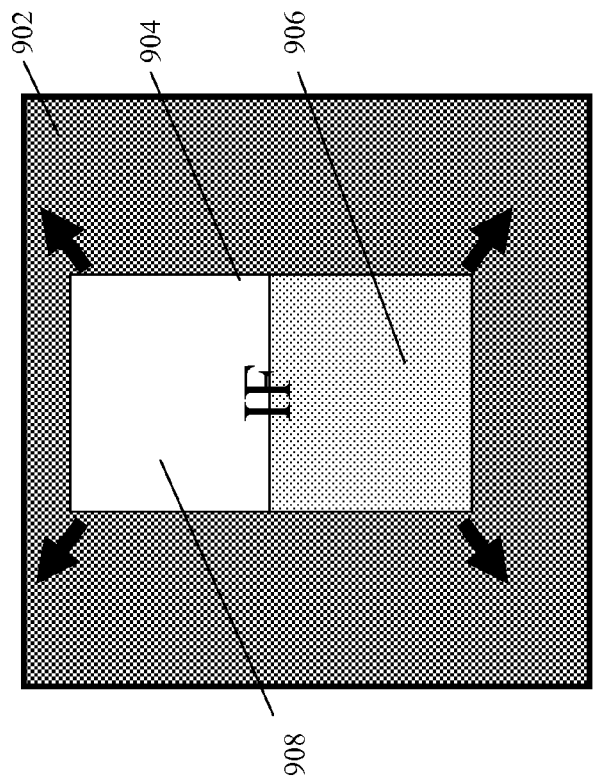
FIGS. 9A and 9B schematically illustrate adjustment of the geometry of an image field with inhomogeneous pattern density on a single layer reticle, in accordance with exemplary embodiments.
Figure 9A:
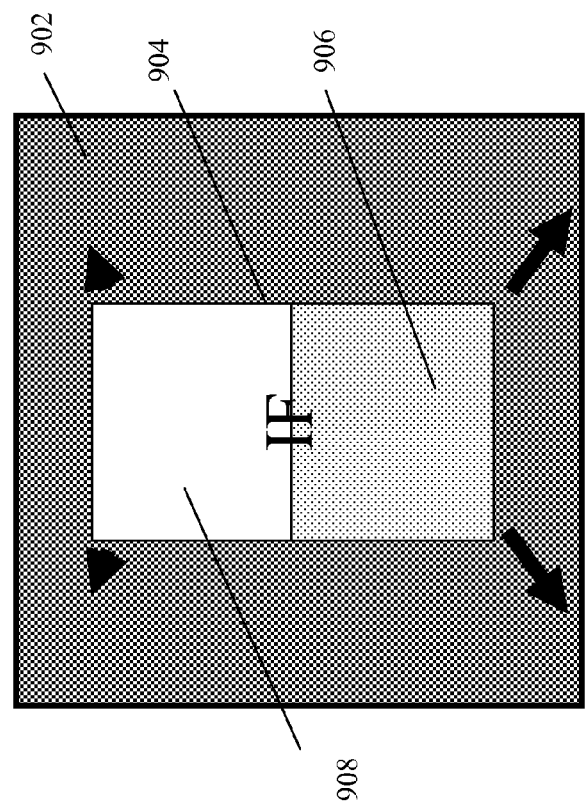

Re-arrangement of the image field can also be used to correct for asymmetric reticle heating and thermal expansion of a single layer reticle with inhomogeneous pattern density in the image field, as illustrated in FIGS. 9A and 9B. Reticle 902 has an image field 904 with a lower region 906 that has less transmission/reflection than the upper region 908. Region 906 will therefore experience stronger absorption of actinic radiation, stronger reticle heating, and more thermal strain than region 908. With conventional symmetric arrangement of image field 904 on reticle 902, thermal expansion will therefore be more pronounced in the lower half than in the upper half of reticle 902, leading to trapezoidal distortion as illustrated by the arrows in FIG. 9A. If image field 904 is shifted upwards, as shown in FIG. 9B, the upper image field region 908 is surrounded by less unexposed reticle material than lower region 906. Since the unexposed, "cold" reticle material counteracts the thermal strain of the heated regions, thermal expansion of the lower image field region is now more restricted than thermal expansion of the upper image field region, which in effect reduces the trapezoidal distortion, as illustrated by the arrows in FIG. 9B. The underlying mechanism of this correction may in the first order be envisaged as shifting the center of mass of the reticle heating and thermal strain towards the reticle center.

In the preceding examples, several embodiments of the present disclosure are presented, in which the effects of asymmetric reticle illumination or asymmetric absorption of radiation in the reticle and the corresponding asymmetric reticle heating and thermal expansion are corrected or reduced either by applying additional illumination to the reticle, or by changing the reticle layout geometry to achieve more symmetric reticle heating and thermal expansion. It is to be understood that for practical realization of all embodiments, it will usually not be necessary to apply the corrections to all chip layers of a product, or all reticles of a reticle set. Rather, it will in most cases suffice to correct only the most overlay critical layers, or the ones most affected by asymmetric thermal effects, which may be as few as one or two layers in the production flow of a product.

The embodiments of the present disclosure can achieve several technical effects, such as uniform or symmetric reticle illumination, heating, or thermal expansion, reduced distortion modes, and increased efficiencies in the production of semiconductor wafers. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of semiconductor devices, particularly for 28 nm and 20 nm devices, double patterning, and multi-purpose wafers.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    performing one or more exposures of a wafer with an actual image field on a reticle, the actual image field including a pattern for a chip layer;
    performing one or more dummy exposures with portions of the reticle outside the actual image field, or portions of the actual image field to reduce asymmetric heating, or asymmetric thermal expansion of the reticle, or asymmetric thermal expansion of the actual image field; and
    alternating performing the one or more dummy exposures and performing the one or more exposures of the wafer with the actual image field of the reticle.

2. The method according to claim 1, comprising using a higher exposure dosage for the dummy exposures than for the exposures of the wafer with the actual image field of the reticle.

3. The method according to claim 1, comprising performing the dummy exposures for a shorter duration than the exposures of the wafer with the actual image field of the reticle and/or performing fewer dummy exposures than exposures with the actual image field.

4. The method according to claim 1, comprising exposing the wafer with an actual image field on a single layer reticle and performing the one or more dummy exposures with one or more portions of the actual image field and/or one or more portions of the reticle outside the image field of the single layer reticle.

5. The method according to claim 4, comprising performing the dummy exposures with one or more regions of the actual image field that have higher transmission or higher reflection than other regions of the actual image field for transmissive or reflective reticles, respectively.

6. The method according to claim 1, comprising performing the dummy exposures onto a dummy wafer.

7. The method according to claim 1, comprising performing the dummy exposures onto one or more areas of the wafer, sacrificing areas of the wafer that are exposed in the dummy exposures with actinic radiation.

8. The method according to claim 1, comprising performing the dummy exposures onto edge portions of a chuck with the wafer thereon or onto a chuck with no wafer thereon.

9. The method according to claim 1, comprising performing the dummy exposure onto a substrate remote from both a chuck and the wafer.

10. The method according to claim 1, comprising exposing the wafer with an actual image field on a multilayer reticle and performing the dummy exposures with a portion of the multilayer reticle including one or more other image fields or portions thereof of the multilayer reticle.

11. The method according to claim 1, comprising selecting a dummy exposure dosage, a dummy exposure duration and a number of dummy exposures relative to a number of exposures with the actual image field to apply a substantially uniform heat per area to the reticle by a combination of the exposures with the actual image field and the dummy exposures in a region of the reticle comprising the actual image field and the additional portions of the reticle used for the dummy exposures.

12. The method according to claim 11, comprising calculating the dummy exposure dosage, the dummy exposure duration, and the number of dummy exposures relative to the number of exposures with the actual image field from at least one of: actual image field exposure dosage, actual image field exposure duration, heat applied to the reticle during exposure of the wafer with the actual image field of the reticle, average transmission or reflection for the actual image field, and average transmission or reflection for the portions of the reticle used for the dummy exposures.

13. The method according to claim 1, comprising spatially modulating the exposure dose in the dummy exposures.

14. A method comprising:
exposing a wafer using actinic radiation, with an area of a reticle belonging to a reticle set, the area of the reticle comprising both an actual image field on the reticle with pattern for a chip layer and portions of the reticle outside the actual image field, to reduce asymmetric reticle heating, or asymmetric thermal expansion of the reticle, or asymmetric thermal expansion of the actual image field;
sacrificing any area on the wafer that is exposed with portions of the reticle outside the actual image field with actinic radiation; and
shifting an alignment between each prior or subsequent reticle of the reticle set and the wafer, before each prior or subsequent exposure of the wafer including a prior or subsequent actual image field to expose the same areas of the wafer with the actual image field and each prior and subsequent actual image field.

15. The method according to claim 14, comprising exposing the wafer with an area of a multilayer reticle, wherein the portions of the reticle outside the actual image field include one or more other image fields or portions thereof.

16. The method according to claim 14, comprising spatially modulating exposure dose in the portions of the reticle outside the actual image field.

17. A method comprising:
providing a reticle having one or more functional image fields for one or more chip layers, the reticle belonging to a reticle set having a standard image field geometry;
modifying an image field geometry of the reticle from the standard image field geometry of the reticle set in at least one of the following respects: (i) position of one or more image fields on the reticle, (ii) size or shape of or number of dies included in one or more image fields on the reticle, (iii) number of image fields on the reticle, and (iv) number of substantially identical copies of one or more image fields on the reticle, for symmetric reticle heating or reduced asymmetric reticle thermal expansion or reduced asymmetric thermal expansion of an image field or more than one substantially identical copies of the image field in the exposure of one or more wafers with an image field or several substantially identical copies of the image field on the reticle; and
exposing one or more wafers with the image field or several substantially identical copies of the image field on the reticle.

18. The method according to claim 17, wherein the reticle set comprises a multilayer reticle set, and a number of substantially different image fields on the reticle is less than a maximum possible number of image fields for another reticle of the multilayer reticle set having the standard image field geometry of the set.

19. The method according to claim 18, comprising horizontally and/or vertically centering one or more functional image fields on the reticle.

20. The method according to claim 18, comprising adding at least one additional die, including a pattern for a chip layer, to at least one image field on the reticle, wherein at least one of the image fields is centered horizontally and/or vertically on the reticle.

21. The method according to claim 18, comprising adding at least one substantially identical copy of at least one image field to the reticle; and alternating between exposures or batches of exposures of all substantially identical copies of the at least one image field in the exposure of one or more wafers.

* * * * *